US011611052B2

(12) United States Patent
Lee

(10) Patent No.: US 11,611,052 B2
(45) Date of Patent: Mar. 21, 2023

(54) ORGANIC LIGHT EMITTING DISPLAY DEVICE AND LIGHTING APPARATUS FOR VEHICLES USING THE SAME

(71) Applicant: LG DISPLAY CO., LTD., Seoul (KR)

(72) Inventor: SeHee Lee, Paju-si (KR)

(73) Assignee: LG DISPLAY CO, LTD., Seoul (KR)

( * ) Notice: Subject to any disclaimer, the term of this patent is extended or adjusted under 35 U.S.C. 154(b) by 50 days.

(21) Appl. No.: 17/386,116

(22) Filed: Jul. 27, 2021

(65) Prior Publication Data
US 2021/0359239 A1    Nov. 18, 2021

Related U.S. Application Data

(60) Continuation of application No. 16/817,778, filed on Mar. 13, 2020, now Pat. No. 11,108,008, which is a (Continued)

(30) Foreign Application Priority Data

Aug. 27, 2015    (KR) .......................... 10-2015-0121099

(51) Int. Cl.
*H01L 51/50*    (2006.01)
*H01L 51/52*    (2006.01)
(Continued)

(52) U.S. Cl.
CPC ............ *H01L 51/5024* (2013.01); *B60Q 1/04* (2013.01); *B60Q 1/22* (2013.01); *B60Q 1/24* (2013.01);
(Continued)

(58) Field of Classification Search
CPC ............. H01L 51/5024; H01L 51/5072; H01L 51/5278
See application file for complete search history.

(56) References Cited

U.S. PATENT DOCUMENTS 9,391,124 B2    7/2016 Oh et al.
9,627,639 B2    4/2017 Lee ........................... B60Q 1/24
(Continued)

FOREIGN PATENT DOCUMENTS

EP    1811586 A1    7/2007
JP    2006-156828 A    6/2006
(Continued)

OTHER PUBLICATIONS

Office Action of the European. Patent Office in Appl'n No. 16170558.7, dated May 4, 2020.
(Continued)

*Primary Examiner* — Thao P Le
(74) *Attorney, Agent, or Firm* — Dentons US LLP

(57) ABSTRACT

Disclosed are an organic light emitting display device and lighting apparatus for vehicles using the same. The organic light emitting display device includes a first layer including a first organic layer and a first emission layer on a first electrode, a second layer including a second emission layer and a second organic layer on the first layer, a second electrode on the second layer, and a third organic layer between the first layer and the second layer. A thickness of the first emission layer is equal to or greater than a thickness of each of the first organic layer and the second organic layer.

50 Claims, 5 Drawing Sheets

Related U.S. Application Data continuation of application No. 16/145,888, filed on Sep. 28, 2018, now Pat. No. 10,629,835, which is a division of application No. 15/451,791, filed on Mar. 7, 2017, now Pat. No. 10,115,922, which is a continuation of application No. 15/154,130, filed on May 13, 2016, now Pat. No. 9,627,639.

(51) Int. Cl.
| | | |
|---|---|---|
| *F21S 43/145* | (2018.01) | |
| *B60Q 1/04* | (2006.01) | |
| *B60Q 1/24* | (2006.01) | |
| *B60Q 1/34* | (2006.01) | |
| *B60Q 1/44* | (2006.01) | |
| *B60Q 1/22* | (2006.01) | |
| *B60Q 1/26* | (2006.01) | |
| *F21S 41/155* | (2018.01) | |

(52) U.S. Cl.
CPC ............ *B60Q 1/2696* (2013.01); *B60Q 1/34* (2013.01); *B60Q 1/44* (2013.01); *F21S 41/155* (2018.01); *F21S 43/145* (2018.01); *H01L 51/5056* (2013.01); *H01L 51/5072* (2013.01); *H01L 51/5278* (2013.01); *H01L 2251/5361* (2013.01); *H01L 2251/5376* (2013.01); *H01L 2251/556* (2013.01); *H01L 2251/558* (2013.01)

(56) References Cited

U.S. PATENT DOCUMENTS

| | | |
|---|---|---|
| 2005/0162075 A1 | 7/2005 | Madathil et al. |
| 2006/0289882 A1 | 12/2006 | Nishimura et al. |
| 2007/0090757 A1 | 4/2007 | Kim et al. |
| 2007/0108443 A1 | 5/2007 | Kim |
| 2010/0159792 A1 | 6/2010 | Visser ................ H01L 51/5234 445/58 |
| 2012/0012824 A1 | 1/2012 | Yuji et al. |
| 2012/0205676 A1 | 8/2012 | Seo et al. |
| 2012/0267644 A1 | 10/2012 | Cho ..................... H01L 51/504 257/88 |
| 2015/0053945 A1 | 2/2015 | Kim ................... H01L 51/0058 257/40 |
| 2015/0102331 A1 | 4/2015 | Seo et al. |
| 2015/0188087 A1 | 7/2015 | Lee |
| 2015/0280161 A1 | 10/2015 | Song et al. |
| 2015/0318507 A1 | 11/2015 | Song et al. |
| 2016/0056401 A1* | 2/2016 | Lee ..................... H01L 51/5016 438/31 |
| 2016/0126297 A1* | 5/2016 | Kim .................... H01L 51/5265 438/35 |
| 2016/0126479 A1* | 5/2016 | Hwang ................ C07D 333/78 257/40 |
| 2016/0141555 A1 | 5/2016 | Song et al. |
| 2016/0164042 A1 | 6/2016 | Cho et al. |
| 2016/0181561 A1* | 6/2016 | Lee ..................... H01L 51/5278 257/40 |
| 2016/0181562 A1 | 6/2016 | Pieh et al. |
| 2016/0190450 A1 | 6/2016 | Hwang ................ H01L 51/008 257/40 |
| 2016/0268535 A1* | 9/2016 | Rausch ............... H01L 51/0087 |
| 2016/0365521 A1 | 12/2016 | Jun ...................... H01L 51/006 |
| 2017/0256719 A1* | 9/2017 | Jang .................... C07D 495/14 |
| 2018/0097186 A1 | 4/2018 | Sim ..................... C07D 495/14 |
| 2019/0055187 A1 | 2/2019 | Kim .................... H01L 51/506 |
| 2022/0242833 A1* | 8/2022 | Huang ................ H01L 51/0073 |
| 2022/0328769 A1* | 10/2022 | Ji ........................ H01L 51/0073 |

FOREIGN PATENT DOCUMENTS

| | | |
|---|---|---|
| JP | 2006351638 A | 12/2006 |
| KR | 2014-0009923 A | 1/2014 |
| KR | 20150044402 A | 4/2015 |

OTHER PUBLICATIONS

U.S. Appl. No. 16/145,888 issued as U.S. Pat. No. 10,629,835.
U.S. Appl. No. 15/451,791 issued as U.S. Pat. No. 10,115,922.
U.S. Appl. No. 15/154,130 issued as U.S. Pat. No. 9,627,639.
The Applicant(s) wish to make of record the references listed on the attached PTO/SB/08 form. The listed documents were previously cited in parent U.S. Appl. No. 16/817,778, filed Mar. 13, 2020, upon which Applicants rely for the benefits provided under 35 U.S.C. § 120. Accordingly, pursuant to 37 C.F.R. § 1.98(d).
U.S. Appl. No. 16/817,778, filed Mar. 13, 2020.
U.S. Appl. No. 16/145,888, now U.S. Pat. No. 10,629,835.
U.S. Appl. No. 15/451,791, now U.S. Pat. No. 10,115,922.
U.S. Appl. No. 15/154,130, now U.S. Pat. No. 9,627,639.

* cited by examiner

ORGANIC LIGHT EMITTING DISPLAY DEVICE AND LIGHTING APPARATUS FOR VEHICLES USING THE SAME

This application is a Continuation of application Ser. No. 16/817,778, filed on Mar. 13, 2020, which is a continuation of application Ser. No. 16/145,888, filed on Sep. 28, 2018, now U.S. Pat. No. 10,629,835, which is divisional of application Ser. No. 15/451,791, filed on Mar. 7, 2017, now U.S. Pat. No. 10,115,922, which is a continuation of application Ser. No. 15/154,130, filed on May 13, 2016, now U.S. Pat. No. 9,627,639, which claims the benefit of Korean Patent Application No. 10-2015-0121099 filed on Aug. 27, 2015, which is hereby incorporated by reference for all purposes as if fully set forth herein.

BACKGROUND

Field of the Invention

The present disclosure relates to an organic light emitting display device, a lighting apparatus for vehicles using the same and a manufacturing method thereof. More particularly, the present disclosure relates to an organic light emitting display device and a lighting apparatus for vehicles using the same, with enhanced efficiency or lifetime.

Discussion of the Related Art

Recently, as society advances to the information-oriented society, the field of display devices which visually express an electrical information signal is rapidly advancing. Various display devices, having excellent performance in terms of thinness, lightness, and low power consumption, are being developed correspondingly.

Examples of the display devices include liquid crystal display (LCD) devices, plasma display panel (PDP) devices, field emission display (FED) devices, organic light emitting display devices, etc.

Particularly, organic light emitting display devices are a self-emitting device. In comparison with other display devices, organic light emitting display devices have fast response time, high emission efficiency, high luminance, and wide viewing angle, and thus, are attracting much attention.

Moreover, organic light emitting diodes (OLEDs) applied to organic light lighting display devices are next-generation light sources having a self-luminance characteristic, and are better in viewing angle, contrast, response time, and power consumption than liquid crystal. Also, OLEDs have a surface emission structure, and thus, are easy to implement into a flexible type display device.

Recently, researches for using OLEDs as light sources of lighting or display devices are being actively conducted due to their beneficial characteristics.

SUMMARY

Accordingly, the present disclosure is directed to an organic light emitting display device, a lighting apparatus for vehicles using the same and a method of manufacturing the same that substantially obviate one or more problems due to limitations and disadvantages of the related art.

Organic light emitting diodes (OLEDs) each include an emission layer which is formed between two electrodes. An electron and a hole are injected from the two electrodes into the emission layer, and an exciton is generated by combining the electron with the hole. The OLEDs are devices based on the principle that light is emitted when the generated exciton is dropped from an excited state to a ground state.

In the emission layer included in each of the OLEDs, a recombination zone which is an exciton generation zone where an electron and a hole are combined moves from a center zone of the emission layer to an organic layer adjacent to the emission layer depending on a temperature. For this reason, since the recombination zone of the emission layer is not located on the emission layer, the emission layer cannot emit light. That is, the emission layer may not contribute to emitting light, causing a reduction in lifetime of organic light emitting display devices.

The inventors recognize the above-described problems and have done various experiments for improving efficiency or lifetime of an organic light emitting display device by adjusting a thickness of each of an emission layer and an organic layer which configure the organic light emitting display device.

Through the various experiments, the inventors have invented an organic light emitting display device and a lighting apparatus for vehicles using the same, which have efficiency or lifetime enhanced by adjusting a thickness of each of an emission layer and an organic layer and maintain the enhanced efficiency or lifetime at a room temperature or a high temperature.

An advantage of the present disclosure is to provide an organic light emitting display device and a lighting apparatus for vehicles using the same, with enhanced efficiency or lifetime.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display device that includes a first layer including a first organic layer and a first emission layer on a first electrode, a second layer including a second emission layer and a second organic layer on the first layer, a second electrode on the second layer, and a third organic layer between the first layer and the second layer, wherein a thickness of the first emission layer is equal to or greater than a thickness of each of the first organic layer and the second organic layer.

A thickness of the second emission layer may be equal to or greater than the thickness of each of the first organic layer and the second organic layer.

The first organic layer may include a hole transfer layer, and the second organic layer may include an electron transfer layer.

The third organic layer may include at least one among a hole transfer layer, an electron transfer layer, and a charge generation layer.

A sum of the thickness of the first emission layer and a thickness of the second emission layer may be equal to or greater than a thickness of the third organic layer.

One among the first electrode and the second electrode may include or may be a semi-transmissive electrode.

The first emission layer and the second emission layer may emit lights having at least substantially the same color.

At least one among the first emission layer and the second emission layer may include two or more kinds of hosts.

At least one among the first emission layer and the second emission layer may include a fluorescent dopant or a phosphorescent dopant.

In another aspect of the present disclosure, there is provided a lighting apparatus for vehicles that includes an organic light emitting device including an anode, a cathode, and an organic layer and an emission layer between the anode and the cathode, wherein a thickness of the emission layer is equal to or greater than a thickness of the organic layer so that even when an emission zone of the emission layer is moved due to a temperature change of a room temperature environment and a high temperature environment relevant to a vehicle, the moved emission zone is still located in the emission zone of the emission layer.

The emission layer may be provided as one or more.

The one or more emission layers may emit lights having at least substantially the same color.

At least one among the one or more emission layers may include two or more kinds of hosts.

At least one among the one or more emission layers may include a fluorescent dopant or a phosphorescent dopant.

The organic layer may include a first organic layer, a second organic layer, and a third organic layer.

The first organic layer may be disposed on the anode and may include a hole transfer layer.

The second organic layer may be disposed under the cathode and may include an electron transfer layer.

The third organic layer may be disposed between the first organic layer and the second organic layer and may include at least one among a hole transfer layer, an electron transfer layer, and a charge generation layer.

The emission layer may include at least one emission layer, and a thickness of the at least one emission layer may be equal to or greater than a thickness of each of the first organic layer and the second organic layer.

The emission layer may include one or more emission layers, and a sum of thicknesses of the one or more emission layers may be equal to or greater than a thickness of the third organic layer.

One among the anode and the cathode may include or may be a semitransmissive electrode.

The temperature may be 25° C. to 90° C.

Details of embodiments are included in a detailed description and the drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE ILLUSTRATED EMBODIMENTS

Figure 1:
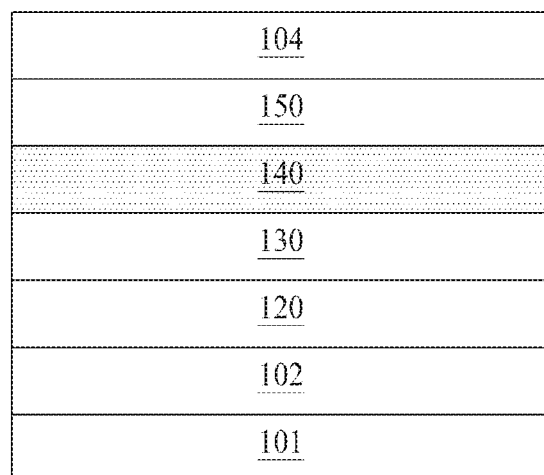
FIG. 1 is a diagram illustrating an OLED according to an embodiment of the present disclosure.

Reference will now be made in detail to exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first". "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a diagram illustrating an OLED 100 according to an embodiment of the present disclosure.

Referring to FIG. 1, the OLED 100 according to an embodiment of the present disclosure may include a substrate 101, first and second electrodes 102 and 104, and a plurality of organic layers 120, 130, 140 and 150 between the first and second electrodes 102 and 104.

The first electrode 102 may be an anode that supplies a hole, and the second electrode 104 may be a cathode that supplies an electron.

A hole injection layer (HIL) 120, a hole transport layer (HTL) 130, an emission layer (EML) 140 and an electron transport layer (ETL) 150, which are organic layers, may be formed on the first electrode 102.

The HIL 120 enables a hole supplied from the first electrode 102 to be smoothly injected into the HTL 130.

The HTL 130 may supply a hole supplied from the HIL 120 to the emission layer 140. The ETL 150 may supply an electron supplied from the second electrode 104 to the emission layer 140. As a result, the hole supplied through the HTL 130 and the electron supplied through the ETL 150 may be recombined in the emission layer 140 to generate an exciton. A zone where the exciton is generated in the emission layer 140 may be referred to as a recombination zone or an emission zone (or an emission area). The emission layer 140 may contribute to emit light when the recombination zone is disposed in the emission layer 140.

The organic layers such as the emission layer 140, the HIL 120, the HTL 130, and the ETL 150 are affected by a change in temperature. Also, when an OLED is applied to a lighting apparatus for vehicles, the OLED is affected by an external environment temperature, and thus, the organic layers included in the OLED are further affected by the external environment temperature. This will now be described in detail with reference to FIG. 2.

Figure 2:
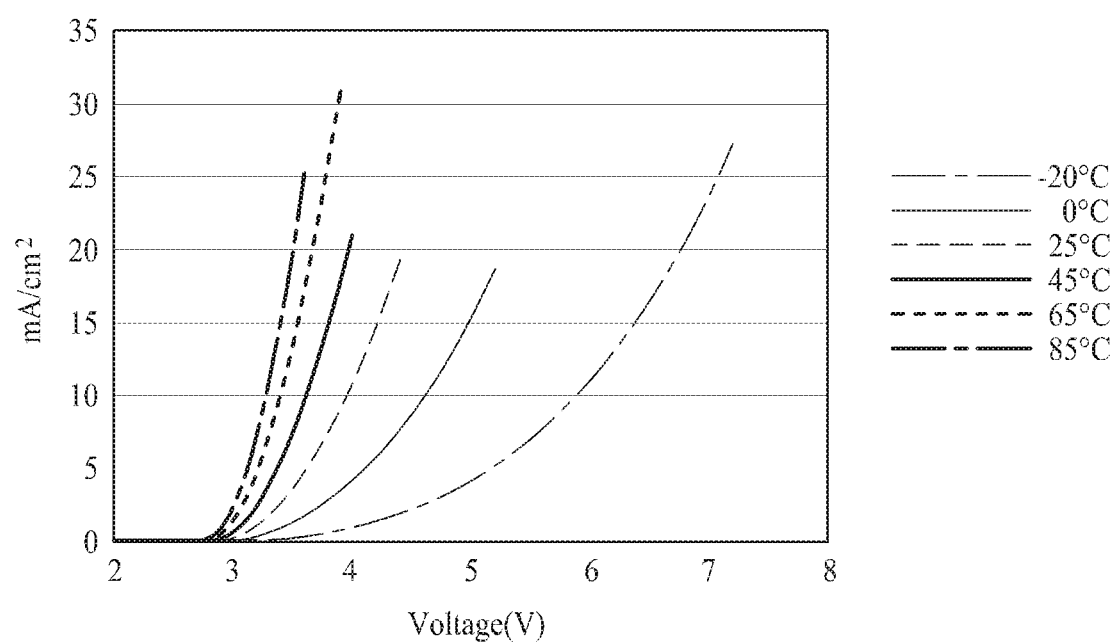
FIG. 2 is a diagram showing a result obtained by measuring a voltage and a current density with respect to a temperature in an embodiment of the present disclosure.

FIG. 2 is a diagram showing results obtained by measuring voltage and current density with reference to temperature according to an embodiment of the present disclosure, wherein the abscissa axis indicates a voltage (V) and the ordinate axis indicates a current density (mA/cm$^2$). The OLED may be loaded into a chamber, and then, a temperature of the chamber may be changed to −20° C., 0° C. 25° C., 45° C., 65° C., and 85° C. In these states, an OLED may be stabilized for about one hour to two hours, and then, the voltage and the current density are measured. The results of the measurement are shown in FIG. 2.

As shown in FIG. 2, when a temperature of the OLED increases, a charge mobility of an organic layer included in the OLED increases quickly, and at a low temperature, the charge mobility of the organic layer is reduced to cause an increase in a voltage. As a result, a charge balance which is a balance of electrons and holes is broken at a temperature lower or higher than a room temperature (25° C.), and a generation zone (the recombination zone or the emission zone) where an exciton is generated by combining an electron with a hole may move from the emission layer to the organic layer. For this reason, the emission layer may not emit light in a desired emission zone. This will now be described in detail with reference to FIG. 3.

Figure 3:
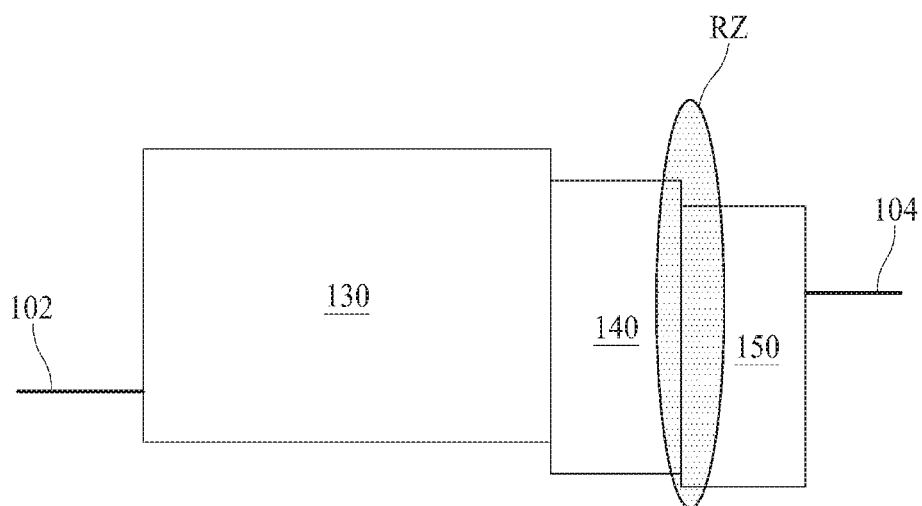
FIG. 3 is a diagram illustrating an emission zone of an emission layer in an embodiment of the present disclosure.

FIG. 3 is a diagram illustrating an emission zone of an emission layer according to an embodiment of the present disclosure.

When a temperature of the OLED increases, a hole mobility of the HTL 130 and an electron mobility of the ETL 150 increase. At this time, a mobility of a charge having a relative high speed increases further, and for this reason, a charge balance which is a balance of previously generated electrons and holes is broken.

Generally, when a temperature of the OLED increases, a hole mobility of the HTL 130 increases due to characteristics of the organic layer, and the emission zone or the recombination zone RZ may be provided in a boundary between the emission layer 140 and the ETL 150 instead of the emission layer 140.

As illustrated in FIG. 3, when the recombination zone RZ is provided in a boundary between the emission layer 140 and the ETL 150 instead of the emission layer 140, an exciton may not contribute to emitting light, and light energy which is to be dissipated through emission of light is changed to thermal transition. If the light energy is changed to the thermal transition, degradation of the OLED is accelerated, causing a reduction in lifetime of the OLED.

Even when the temperature changes from such a high temperature back to the room temperature, the lifetime of the OLED is reduced at the room temperature because the OLED has been already degraded at the high temperature. On the other hand, if the electron mobility of the ETL 150 increases, the emission zone or the recombination zone RZ is provided in the HTL 130 or a boundary between the emission layer 140 and the HTL 130 instead of the emission layer 140. As a result, if the recombination zone RZ is provided in the HTL 130 or a boundary between the emission layer 140 and the HTL 130 instead of the emission layer 140, an exciton may not contribute to emitting light, and light energy which is to be dissipated through emission of light is changed to thermal transition. If the light energy is changed to the thermal transition, degradation of the OLED is accelerated, causing a reduction in lifetime of the OLED.

To address such a problem, in an organic light emitting display device and a lighting apparatus for vehicles using the same according to an embodiment of the present disclosure, a thickness of an emission layer and a thickness of an organic layer are adjusted to enhance efficiency or lifetime of the organic light emitting display device at the room temperature or a high temperature.

Figure 4:
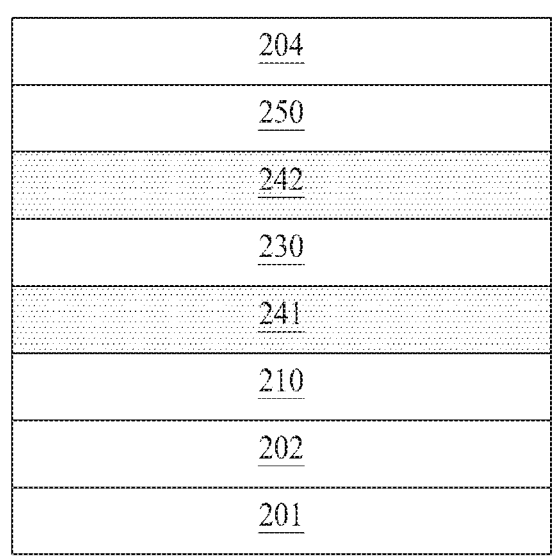
FIG. 4 is a diagram illustrating an OLED according to another embodiment of the present disclosure.

FIG. 4 is a diagram illustrating an OLED 200 according to another embodiment of the present disclosure.

Referring to FIG. 4, the OLED 200 may include a substrate 201, first and second electrodes 202 and 204, and a plurality of organic layers 210, 230 and 250 and a plurality of emission layers 241 and 242 between the first and second electrodes 202 and 204. That is, the OLED 200 may include a first layer including a first organic layer 210 and a first emission layer 241 on the first electrode 202, a second layer including a second emission layer 242 and a second organic layer 250 on the first layer, the second electrode 204 on the second layer, and a third organic layer 230 between the first layer and the second layer.

The substrate 201 may be formed of an insulating material or a material having flexibility. The substrate 201 may be formed of glass, metal, plastic, and/or the like, but is not limited thereto. If an organic light emitting display device is a flexible organic light emitting display device, the substrate 201 may be formed of a flexible material such as plastic and/or the like. Also, if an organic light emitting device which is easy to realize flexibility is applied to a lighting device for vehicles, various designs and a degree of freedom of design of a light device for vehicles are secured according to a structure or an appearance of a vehicle.

The first electrode 202 is an anode that supplies a hole, and may be formed of indium tin oxide (ITO), indium zinc oxide (IZO), or the like which is a transparent conductive material such as transparent conductive oxide (TCO). However, the present embodiment is not limited thereto. Alternatively, the first electrode 202 may be formed of gold (Au), silver (Ag), aluminum (Al), molybdenum (Mo), magnesium (Mg), Lithium (Li), calcium (Ca), lithium fluoride (LiF), Ag—Mg, ITO, IZO, and/or the like, may be formed of an alloy thereof, or may be formed of a single layer or a multilayer. However, the present embodiment is not limited thereto.

Moreover, the first electrode 202 may include a reflective layer in order for light L, emitted from each of the emission layers 241 and 242, not to be irradiated in a down direction through the first electrode 202. In detail, the first electrode 202 may have a three-layered structure where a first transparent layer, a reflective layer, and a second transparent layer are sequentially stacked. The first transparent layer and the second transparent layer may each be formed of TCO such as ITO. IZO, or the like. The reflective layer between two the transparent layers may be formed of a metal material such as copper (Cu), silver (Ag), palladium (Pd), or the like. For example, the first electrode 202 may be formed of ITO/Ag/ITO. Alternatively, the first electrode 202 may have a two-layered structure where a transparent layer and a reflective layer are stacked.

The second electrode 204 is a cathode that supplies an electron, and may be formed of Au. Ag, Al, Mo, Mg. Li, Ca, LiF, ITO, IZO, Ag—Mg, and/or the like, or may be formed of an alloy thereof. The second electrode 204 may be formed with a single layer or multiple layers. However, the present embodiment is not limited thereto.

Each of the first electrode 202 and the second electrode 204 may be referred to as an anode or a cathode. Alternatively, the first electrode 202 may be formed as a transmissive electrode, and the second electrode 204 may be formed as a semi-transmissive electrode. Alternatively, the first electrode 202 may be formed as a reflective electrode, and the second electrode 204 may be formed as a semi-transmissive electrode. Alternatively, the first electrode 202 may be formed as a semi-transmissive electrode, and the second electrode 204 may be formed as a transmissive electrode. Alternatively, at least one among the first and second electrodes 202 and 204 may be formed as a semi-transmissive electrode.

Moreover, a capping layer may be further formed on the second electrode 204, for protecting the OLED. Also, the capping layer may be omitted depending on the structure or characteristic of the OLED.

A first organic layer 210, a second organic layer 250, and a third organic layer 230 which are the organic layers may be disposed on the first electrode 202.

The first organic layer 210 may be disposed on the first electrode 202. The first organic layer 210 may be formed as a hole transfer layer which injects a hole or transfers the hole. For example, the hole transfer layer which is the first organic layer 210 may be formed of at least one layer of an HIL and an HTL. Alternatively, the first organic layer 210 may be formed of two or more HILs. Alternatively, the first organic layer 210 may be formed of two or more HTLs. Alternatively, the first organic layer 210 may be formed of an HIL and an HTL.

Moreover, the first organic layer 210 may be formed with multiple layers capable of being doped. A doping material may be an organic material or an inorganic material and may include metal.

For example, the HTL may be formed of 2,3,5,6-tetrofluoro-7,7,8,8-tetracyano-quinodimethane (F4-TCNQ), copper complex (CuPc), and/or the like, but is not limited thereto.

For example, the HTL may be formed of N,N'-bis(naphthalene-1-yl)-N,N'-bis(phenyl)-2,2'-dimethylbenzidine (NPD), N,N'bis(naphthalene-1-yl)-N,N'-bis(phenyl)-benzidine (NPB), N,N'Obis(3-methylphenyl)-N,N'-bis(phenyl)-benzidine (TPD), and/or the like, but is not limited thereto.

The second organic layer 250 may be disposed under the second electrode 204. The second organic layer 250 may be formed as an electron transfer layer which injects an electron or transfers the electron. For example, the electron transfer layer which is the second organic layer 250 may be formed of at least one layer of an EIL and an ETL. Alternatively, the second organic layer 250 may be formed of two or more EILs. Alternatively, the second organic layer 250 may be formed of two or more ETLs. Alternatively, the second organic layer 250 may be formed of an EIL and an ETL.

Moreover, the second organic layer 250 may be formed with multiple layers capable of being doped. A doping material may be an organic material or an inorganic material and may include metal.

For example, the EIL may be formed of LiF and/or the like, but is not limited thereto.

For example, the ETL may be formed of tris(8-hydroxyquinolonato)aluminum ($Alq_3$), 8-hydroxyquinolinolatolithiun (Liq), and/or the like, but is not limited thereto.

The third organic layer 230 may be disposed between the first layer including the first organic layer 210 and the first emission layer 241, and the second layer including the second emission layer 242 and the second organic layer 250. The third organic layer 230 may include at least one among an electron transfer layer that injects or transfers an electron, a hole transfer layer that injects or transfers a hole, and a charge generation layer (CGL) that generates the electron or the hole. The electron transfer layer may include one among an EIL and an ETL. Alternatively, the electron transfer layer may include one among an EIL that injects an electron, an ETL that transports the electron, and an N-type CGL that generates the electron. The hole transfer layer may include one among an HIL and an HTL. Alternatively, the hole transfer layer that injects, transfers, or generates a hole may include one among an HIL, an HTL, and a P-type CGL. Also, the CGL may include one among the N-type CGL and the P-type COL. Therefore, the third organic layer 230 may include at least one among an EIL, an ETL, an HIL, an HTL, an N-type CGL, and a P-type CGL.

When the electron transfer layer includes one among the EIL, the ETL, and the N-type CGL and the hole transfer layer includes one among the HIL, the HTL, and the P-type COL, the electron transfer layer and hole transfer layer of the third organic layer 230 may be disposed adjacent to each other and may have a PN junction. As a result, the third organic layer 230 may include the ETL, the N-type CGL, the P-type CGL, and the HTL which are disposed on the first EML 241.

Moreover, the third organic layer 230 may be formed with multiple layers capable of being doped. A doping material may be an organic material or an inorganic material and may include metal.

For example, the HTL may be formed of 2,3,5,6-tetrofluoro-7,7,8,8-tetracyano-quinodimethane (F4-TCNQ), copper complex (CuPc), and/or the like, but is not limited thereto.

For example, the HTL may be formed of N,N'-bis(naphthalene-1-yl)-N,N'-bis(phenyl)-2,2'-dimethylbenzidine (NPD), N,N'bis(naphthalene-1-yl)-N,N'-bis(phenyl)-benzidine (NPB), N,N'Obis(3-methylphenyl)-N,N'-bis(phenyl)-benzidine (TPD), and/or the like, but is not limited thereto.

For example, the EIL may be formed of LiF and/or the like, but is not limited thereto.

For example, the ETL may be formed of tris(8-hydroxyquinolonato)aluminum (Alq$_3$), 8-hydroxyquinolinatolithiun (Liq), and/or the like, but is not limited thereto.

The N-type CGL may inject an electron into the first EML 241. The N-type CGL may be formed as an organic layer which is doped with alkali metal such as lithium (Li), sodium (Na), potassium (K), or cesium (Cs) or alkali earth metal such as magnesium (Mg), strontium (Sr), barium (Ba), or radium (Ra), but is not limited thereto.

The P-type CGL included in the third organic layer 230 may inject a hole into the second EML 242. The P-type CGL may be formed as an organic layer including a P-type dopant, but is not limited thereto.

The first organic layer 210 may supply a hole, supplied from the first electrode 202, to the first EML 241. The electron transfer layer or the CGL included in the third organic layer 230 may supply an electron, supplied from the second electrode 204, to the first EML 241. As a result, the hole supplied through the first organic layer 210 and the electron supplied through the third organic layer 230 may be recombined in the first EML 241 to generate an exciton. A zone where the exciton is generated in the first EML 241 may be referred to as a recombination zone or an emission zone (or an emission area).

The hole transfer layer or the CGL included in the third organic layer 230 may supply the hole, supplied from the first electrode 202, to the second EML 242. The second organic layer 250 may supply the electron, supplied from the second electrode 204, to the second EML 242. As a result, the hole supplied through the third organic layer 230 and the electron supplied through the second organic layer 250 may be recombined in the second EML 242 to generate an exciton. A zone where the exciton is generated in the second EML 242 may be referred to as a recombination zone or an emission zone (or an emission area).

The first EML 241 and the second EML 242 may be emission layers that emit lights having at least substantially the same color, respectively. For example, the first EML 241 and the second EML 242 may be one among a red EML, a green EML, and a blue EML. As a result, the OLED according to an embodiment of the present disclosure may be a mono light emitting device that emits lights having at least substantially the same color.

Moreover, the first EML 241 and the second EML 242 may each include at least one host and at least one dopant. The at least one host may include a host having hole characteristic or a host having electron characteristic. Alternatively, the at least one host may be a mixed host including two or more kinds of hosts. When the at least one host includes two or more kinds of hosts, the at least one host may include a host having hole characteristic and a host having electron characteristic. Also, the at least one dopant may be a fluorescent dopant or a phosphorescent dopant.

When each of the first EML 241 and the second EML 242 is the red EML, the at least one host may include one or more host materials, and examples of the host materials may include 4,4'bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, and/or the like. The at least one dopant may include a phosphorescent dopant, and examples of the phosphorescent dopant may include bis(2-benzo[b]thiophen-2-yl-pyridine) (acetylacetonate(iridium(III)) (Ir(btp)$_2$(acac)), bis(1-phenylisoquinoline)(acetylacetonate)iridium(III) (Ir(piq)$_2$(acac)), tris(1-phenylquinoline)iridium(III) (Ir(piq)$_3$), 5,10,15,20-tetraphenyltetrabenzoporphyrin platinum complex (Pt (TPBP)), and/or the like. Alternatively, the at least one dopant may be a fluorescent dopant, and examples of the fluorescent dopant may include perylene and/or the like. The host material or the dopant material constituting the red EML does not limit details of the present disclosure.

When each of the first EML 241 and the second EML 242 is the green EML, the at least one host may include one or more host materials, and examples of the host materials may include 4,4'bis(carbozol-9-yl)biphenyl (CBP), 1,3-bis(carbazol-9-yl)benzene (MCP), N,N'-bis(naphthalene-1-yl)-N,N'-bis(phenyl)-2,2'-dimethylbenzidine (NPD), Be complex, and/or the like. The at least one dopant may be a phosphorescent dopant, and examples of the phosphorescent dopant may include tris(2-phenylpyridine)iridium(III) (Ir(ppy)$_3$), Bis(2-phenylpyridine)(acetylacetonato)iridium(III) (Ir(ppy)$_2$(acac)), and/or the like. Alternatively, the at least one dopant may be a fluorescent dopant, and examples of the fluorescent dopant may include tris(8-hydroxyquinolino) aluminum (Alq$_3$) and/or the like. The host material or the dopant material constituting the green EML does not limit details of the present disclosure.

When each of the first EML 241 and the second EML 242 is the blue green EML, the at least one host may include one or more host materials, and examples of the host materials may include 4,4'bis(carbozol-9-yl)biphenyl (CBP), 1,3-bis(carbazol-9-yl)benzene (MCP), 9,10-di(naphth-2-yl)anthracene (AND), and/or the like. The at least one dopant may be a phosphorescent dopant, and examples of the phosphorescent dopant may include (Bis[2-(4,6-difluorophenyl)pyridinato-N]picolinato)iridium(III) (Firpic) and/or the like. Alternatively, the at least one dopant may be a fluorescent dopant, and examples of the fluorescent dopant may include polyfluorene (PFO)-based polymer, polyphenylenevinylene (PPV)-based polymer, and/or the like. The host material or the dopant material constituting the blue EML does not limit details of the present disclosure.

In another embodiment of the present disclosure, the emission layer may be configured to have a thickness that is equal to or greater than that of each of the organic layers, for enhancing efficiency or lifetime of the OLED at the room temperature or a high temperature. Also, the emission layer may be configured to have a thickness that is equal to or greater than that of each of the organic layers, irrespective of the number of the organic layers or the emission layers configuring the OLED. This will now be described in detail with reference to Table 1 and FIGS. 5 and 6.

Table 1 shows a result which is obtained by measuring the efficiencies and color coordinates of comparative examples 1 and 2 and the efficiencies and color coordinates of embodiments 1 and 2 of the present disclosure. The efficiencies have been measured at the room temperature of 25° C.

TABLE 1

|  | Efficiency (Cd/A) | CIEx | CIEy |
|---|---|---|---|
| Comparative Example 1 | 57 | 0.684 | 0.312 |
| Comparative Example 2 | 84 | 0.682 | 0.316 |
| Embodiment 1 | 80.5 | 0.686 | 0.312 |
| Embodiment 2 | 82.1 | 0.686 | 0.312 |

Referring to Table 1, in comparative example 1, a first electrode is formed on a substrate, and a first organic layer, an emission layer, and a third organic layer are formed on the first electrode. Also, a second electrode is formed on the third organic layer, and a capping layer is formed for protecting an OLED. The first organic layer is formed of N,N'-bis(naphthalene-1-yl)-N,N'-bis(phenyl)-2,2'-dimethylbenzidine (NPD), a zone adjacent to the substrate is doped with 2,3,5,6-tetrofluoro-7,7,8,8-tetracyano-quinodimethane (F4-TCNQ), and a thickness of the first organic layer is adjusted to 230 nm. Also, the emission layer is formed as a red EML. The emission layer includes Be complex as a host material, and bis(2-benzo[b]thiophen-2-yl-pyridinexacetylacetonate(iridium(III)) ($Ir(btp)_2(acac)$) as a dopant. A thickness of the emission layer is adjusted to 30 nm. The third organic layer is formed of tris(8-hydroxy-quinolinato)aluminum ($Alq_3$) and 8-hydroxyquinolinolato-lithium (Liq), and a thickness of the third organic layer is adjusted to 30 nm. The capping layer is formed of N,N'-bis(naphthalene-1-yl)-N,N'bis(phenyl)-2,2'-dimethylbenzidine (NPD). Here, the materials of the first organic layer, the emission layer, the third organic layer, and the capping layer do not limit details of the present disclosure.

In comparative example 2, a first electrode is formed on a substrate, and a first organic layer, a first EML, a third organic layer, a second EML, and a second organic layer are formed on the first electrode. A second electrode is formed on the second organic layer, and a capping layer is formed for protecting an OLED. Each of the first organic layer, the first EML, and the capping layer is formed of the same material as a material applied to the comparative example 1. Also, each of the first EML and the second EML is formed as a red EML. A thickness of the first organic layer is adjusted to 85 nm, and a thickness of the first EML is adjusted to 30 nm. Also, the third organic layer is an electron transfer layer and is formed of oxadiazole, a zone adjacent to a hole transfer layer of the third organic layer is doped with Li, and a thickness of the electron transfer layer is adjusted to 25 nm. Also, the third organic layer is a hole transfer layer and is formed of NPD, a zone adjacent to the hole transfer layer of the third organic layer is doped with F4-TCNQ, and a thickness of the hole transfer layer is adjusted to 90 nm. Therefore, a thickness of the third organic layer is adjusted to 115 nm. The second EML includes Be complex as a host material (for example, and/or the like) and $Ir(btp)_2(acac)$ as a dopant, and a thickness of the second EML is adjusted to 30 nm. The second organic layer is formed of $Alq_3$ and Liq, and a thickness of the second organic layer is adjusted to 30 nm. Here, the materials of the first organic layer, the first EML, the third organic layer, the second EML, the second organic layer, and the capping layer do not limit details of the present disclosure.

In embodiment 1, a first electrode is formed on a substrate, and a first organic layer, a first EML, a third organic layer, a second EML, and a second organic layer are formed on the first electrode. A second electrode is formed on the second organic layer, and a capping layer is formed for protecting an OLED. The embodiment 1 is configured identically to the comparative example 2 and uses the same materials as materials applied to the comparative example 2. A thickness of the first organic layer is 45 nm, and a thickness of the first EML is 70 nm. A thickness of the third organic layer is 75 nm. A thickness of the second EML is 70 nm, and a thickness of the second organic layer is 30 nm. Here, the materials of the first organic layer, the first EML, the third organic layer, the second EML, the second organic layer, and the capping layer do not limit details of the present disclosure.

In embodiment 2, a first electrode is formed on a substrate, and a first organic layer, a first EML, a third organic layer, a second EML, and a second organic layer are formed on the first electrode. A second electrode is formed on the second organic layer, and a capping layer is formed for protecting an OLED. The embodiment 2 is configured identically to the embodiment 1 and uses the same materials as materials applied to the embodiment 1. Also, a host of each of the first and second EMLs may be a mixed host. The host of each of the first and second EMLs includes Be complex and NPD, and a dopant of each of the first and second EMLs includes $Ir(btp)_2(acac)$. When the host included in each of the first and second EMLs is the mixed host instead of a single host, a charge balance of each of the first and second EMLs may be adjusted. Also, when each of the first and second EMLs is formed of the mixed host, it is easy to adjust a charge balance when a thickness of each of the first and second EMLs is thickened. A thickness of the first organic layer is 45 nm, and a thickness of the first EML is 70 nm. A thickness of the third organic layer is 75 nm. A thickness of the second EML is 70 nm, and a thickness of the second organic layer is 30 nm. Here, the materials of the first organic layer, the first EML, the third organic layer, the second EML, the second organic layer, and the capping layer do not limit details of the present disclosure.

As shown in Table 1, the efficiency is further enhanced in embodiments 1 and 2 as compared with comparative example 1. That is, it can be seen that the efficiency of comparative example 1 is 57 Cd/A, the efficiency of embodiment 1 is 80.5 Cd/A. and the efficiency of embodiment 2 is 82.1 Cd/A. It can be also seen that the efficiencies of embodiments 1 and 2 are similar to that of comparative example 2.

Color coordinates represent red color coordinates. To describe color coordinates (CIEx, CIEy), it can be seen that in the comparative examples and the embodiments, the color coordinates are not changed despite a thickness difference between the organic layers. Through this, when a thickness of the first EML or a thickness of the second EML is equal to or greater than that of each of the first and second organic layers, the color coordinates are not changed despite the thickness difference between the organic layers, and thus, it can be seen that a desired color is realized. Alternatively, when a sum of a thickness of the first EML and a thickness of the second EML is equal to or greater than that of the third organic layer, the color coordinates are not changed despite the thickness difference between the organic layers, and thus, it can be seen that a desired color is realized.

The results which are obtained by measuring lifetime characteristic at the room temperature and a high temperature will be described below with reference to FIGS. 5 and 6.

Figure 5:
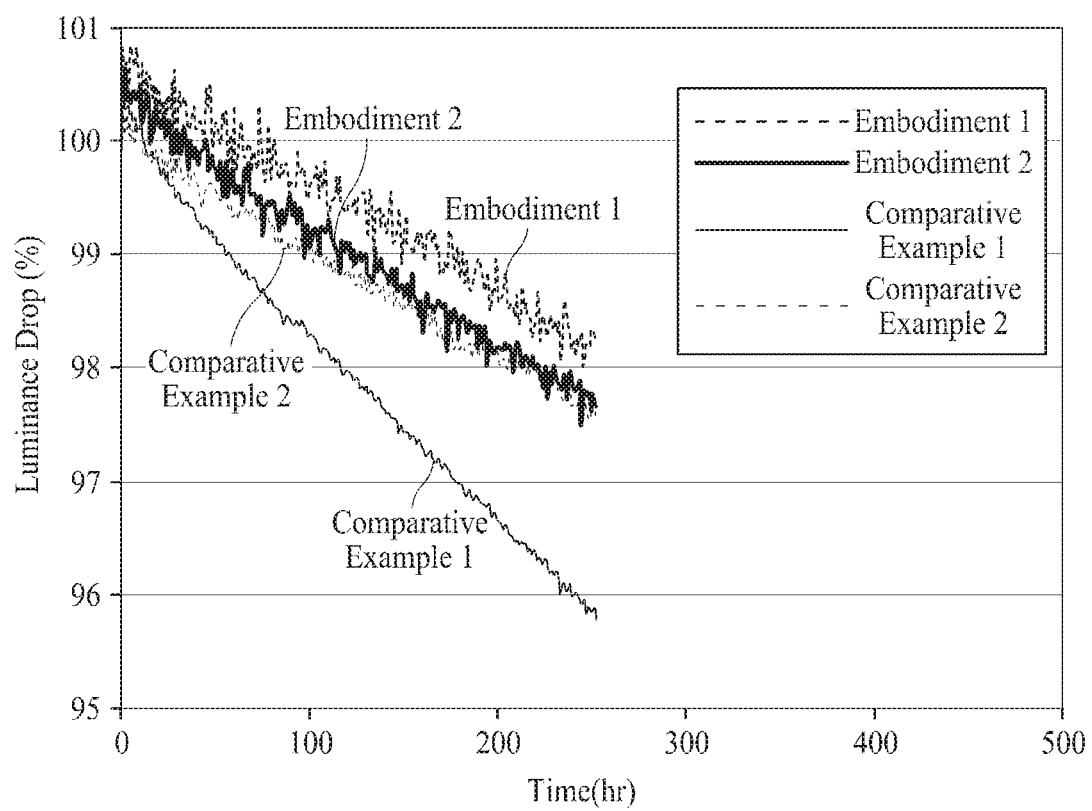
FIG. 5 is a diagram showing lifetime characteristic at a room temperature in a comparative example and embodiments of the present disclosure.

FIG. 5 is a diagram showing lifetime characteristic at a room temperature in a comparative example and embodiments of the present disclosure.

In FIG. 5, the abscissa axis indicates a time (hr), and the ordinate axis indicates a luminance drop rate (%). Also, FIG. 5 shows the results that are obtained by measuring lifetime characteristic at the room temperature of 25° C.

As shown in FIG. 5, the lifetime characteristic is further enhanced in comparative example 2 and embodiments 1 and 2 as compared with comparative example 1 with respect to a time (i.e., 95% lifetime (T95) of an OLED) taken until the emission luminance corresponding to 95% of an initial emission luminance is obtained.

In addition, it can be seen that a luminance drop rate is rapidly lowered with time in comparative example 1 in comparison with comparative example 2 and embodiments 1 and 2. Also, it can be seen that luminance drop rates are almost similar with time in comparative example 2 and embodiments 1 and 2. As a result, it can be seen that when a thickness of an emission layer is greater than that of an organic layer, lifetime is enhanced. That is, it can be seen that when a thickness of a first EML or a thickness of a second EML is equal to or greater than that of each of first and second organic layers, lifetime is enhanced. Also, it can be seen that when a sum of a thickness of the first EML and a thickness of the second EML is equal to or greater than that of a third organic layer, lifetime is enhanced.

Moreover, in comparative example 2 where a thickness of the emission layer is less than that of the organic layer, it can be seen that the lifetime characteristic at the room temperature is secured. In a case of a high temperature, when injection of an electron and a hole and a mobility of each of the electron and the hole are changed to move a recombination zone that is an exciton generation zone, the recombination zone may be located in the organic layer adjacent to the emission layer without being located in the emission layer. When light is emitted from the organic layer adjacent to the emission layer, the emission layer may not contribute to emitting the light, and light energy which is to be dissipated through emission of the light is changed to thermal transition. If the light energy is changed to the thermal transition, deterioration of the OLED is accelerated, causing a reduction in lifetime of the OLED. As a result, according to an embodiment of the present disclosure, a thickness of the emission layer may be equal to or greater than that of the organic layer, and thus, even when the recombination zone is moved because a charge balance is changed due to a change in mobility or injection of an electron or a hole at the room temperature or the high temperature, the recombination zone may be located in the emission layer, thereby providing an organic light emitting display device or a lighting device for vehicles, which maintains enhanced reliability or stability at the room temperature or the high temperature. Lifetime characteristic at a high temperature will be described below with reference to FIG. 6.

Figure 6:
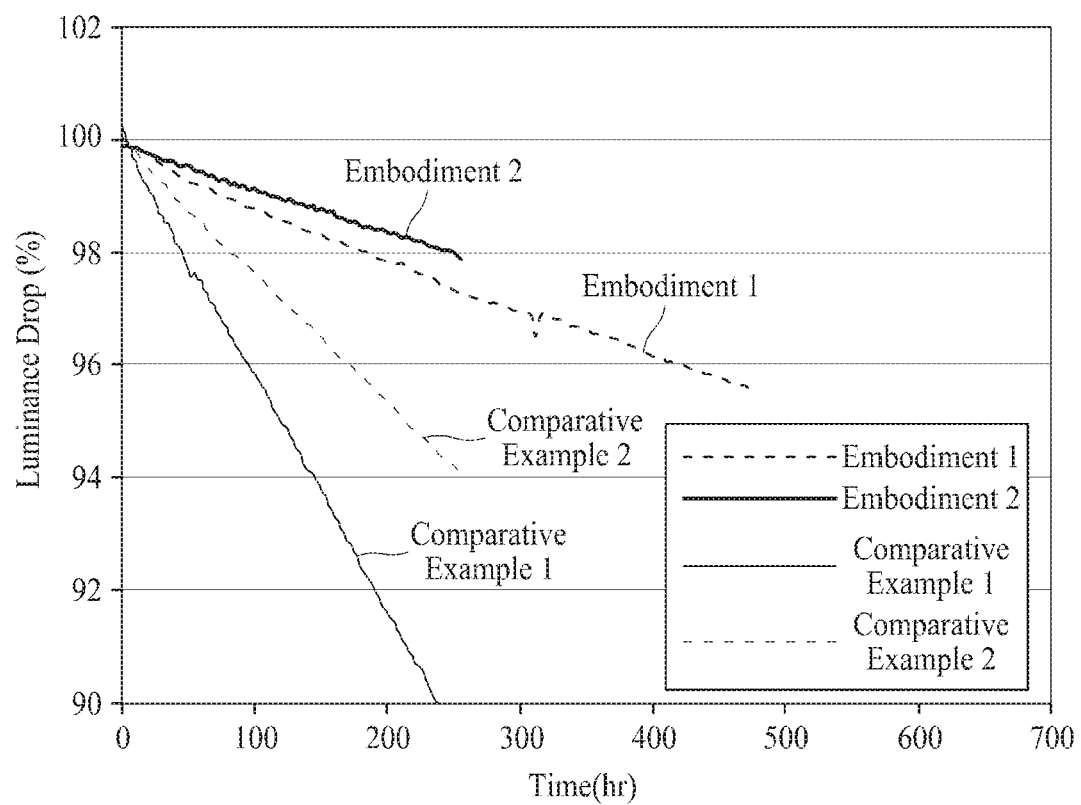
FIG. 6 is a diagram showing lifetime characteristic at a high temperature in a comparative example and embodiments of the present disclosure.

FIG. 6 is a diagram showing lifetime characteristic at a high temperature in a comparative example and embodiments of the present disclosure.

In FIG. 6, the abscissa axis indicates a time (hr), and the ordinate axis indicates a luminance drop rate (%). FIG. 6 shows the results that are obtained by measuring lifetime characteristic at 60° C. The results of the measurement may be similar to lifetime characteristic at 85° C.

A temperature range desired by the organic light emitting display device may be a range of 60° C. to 90° C. The temperature range may be referred to as a temperature range which enables the OLED to endure in a process of manufacturing the organic light emitting display device, and may be changed depending on a manufacturing process condition. Also, when the temperature range is applied to a lighting apparatus for vehicles, the temperature range may be a range of −40° C. to 90° C. depending on a temperature change of an external environment.

As shown in FIG. 6, the lifetime characteristic is further enhanced in embodiments 1 and 2 as compared with comparative examples 1 and 2 with respect to a time (i.e., 90% lifetime (T90) of an OLED) taken until the emission luminance corresponding to 90% of an initial emission luminance is obtained. Also, in a case of measuring 95% lifetime (T95) of the OLED as in FIG. 5, lifetime is rapidly reduced in comparative examples 1 and 2, and thus, in order to address a problem where it is difficult to check a measurement result of lifetime characteristic. FIG. 6 shows the results which are obtained by measuring 90% lifetime (T90) of the OLED.

In embodiments 1 and 2, since a thickness of an emission layer is equal to or greater than that of each of organic layers, it can be seen that in a case where the OLED is driven at a high temperature, even when a recombination zone or an emission zone of the emission layer is moved, the recombination zone or the emission zone is still located in the emission layer, and thus, lifetime is enhanced. Also, it can be seen that lifetime is further enhanced in embodiment 2, to which a mixed host is applied, than embodiment 1. Since a charge balance of the emission layer is adjusted by the mixed host, it can be seen that a luminance drop rate with respect to a time is low, and lifetime is enhanced.

Moreover, it can be seen that lifetime characteristic at a high temperature is further degraded in comparative example 2 than embodiments 1 and 2. As a result, since a thickness of the emission layer is equal to or greater than that of each of the organic layers, it can be seen that in a case where the OLED is driven at the room temperature or the high temperature, even when the recombination zone or emission zone of the emission layer is moved, the recombination zone or the emission zone is still located in the emission layer, and thus, lifetime is enhanced.

Also, it can be seen that a temperature range corresponding to the room temperature or the high temperature may be a temperature range of 25° C. to 90° C., and lifetime of the organic light emitting display device or the lighting apparatus for vehicles according to an embodiment of the present disclosure is enhanced within a temperature range of 25° C. to 90° C. Also, since lifetime at the high temperature is enhanced, it can be seen that the high-temperature stability of the organic light emitting display device or the lighting apparatus for vehicles is enhanced.

Figure 7:
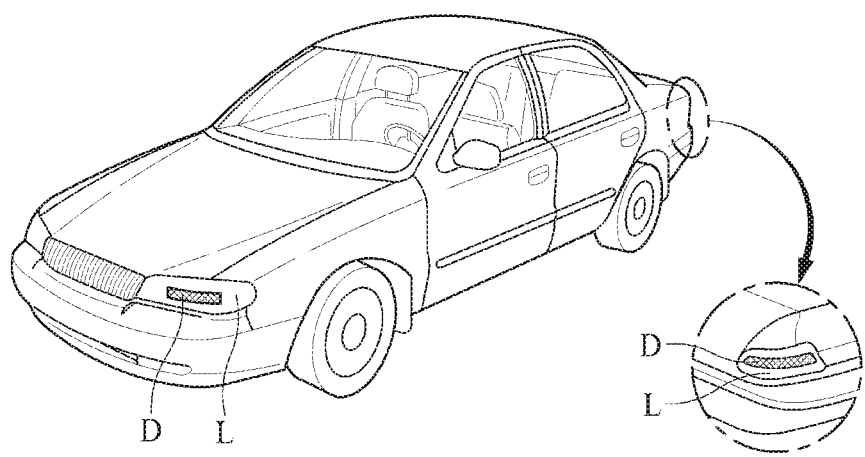
FIG. 7 is a diagram illustrating a lighting apparatus for vehicles according to another embodiment of the present disclosure.

FIG. 7 is a diagram illustrating a vehicle lighting apparatus L including an OLED according to another embodiment of the present disclosure.

The vehicle lighting apparatus L of FIG. 7 may be mounted on a front surface or a rear surface of a vehicle and may secure a front view or a rear view of a driver when the vehicle is driving. The vehicle lighting apparatus L according to another embodiment of the present disclosure may be at least one among headlights, a high beam, taillights, a brake light, a back-up light, a fog lamp, a turn signal light, and an auxiliary lamp, but is not limited thereto. Alternatively, the vehicle lighting apparatus L may be applied to all indicator lamps which are used to secure a field of view of a driver and transmit or receive a signal of a vehicle. FIG. 7 does not limit vehicle lighting applied to the vehicle lighting apparatus L according to the present embodiment.

The vehicle lighting apparatus L according to the present embodiment may include an OLED D, may surface-emit light, and may have a flexible structure. The OLED D included in the vehicle lighting apparatus L may have the structure described above with reference to FIGS. 4 to 6. The OLED D may include a substrate, first and second electrodes, and a plurality of organic layers and a plurality of emission layers between the first and second electrodes. That is, the OLED D may include a first layer including a first organic layer and a first EML on the first electrode, a second layer including a second EML and a second organic layer on the first layer, the second electrode on the second layer, and a third organic layer between the first layer and the second layer.

In the OLED D, in a case where a thickness of the first EML or a thickness of the second EML is equal to or greater than that of each of the first and second organic layers, when a vehicle drives at the room temperature or a high temperature, a recombination zone or an emission zone which is an exciton generation zone where an electron and a hole are recombined to generate an exciton may be located in the emission layer. Also, in a case where a sum of a thickness of the first EML and a thickness of the second EML is equal to or greater than that of the third organic layer, when the vehicle drives at the room temperature or the high temperature, the recombination zone or the emission zone which is the exciton generation zone where the electron and the hole are recombined to generate the exciton may be located in the emission layer. Accordingly, provided is a lighting apparatus for vehicles, which maintains enhanced lifetime when a vehicle drives at the room temperature or the high temperature.

As described above, according to the embodiments of the present disclosure, the emission layer may be configured to have a thickness that is equal to or greater than that of each of the organic layers, thereby providing an organic light emitting display device or a lighting apparatus for vehicles, with enhanced efficiency or lifetime at a room temperature or a high temperature.

Moreover, according to the embodiments of the present disclosure, since the OLED is configured in a structure where a thickness of the emission layer is equal to or greater than that of each of the organic layers, the emission zone of the emission layer is maintained in the emission layer despite a change.

Moreover, the organic light emitting display device or the lighting apparatus for vehicles according to the embodiments of the present disclosure maintains enhanced lifetime at a high temperature and secures safety at a high temperature.

The details of the present disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. An organic light emitting display device, comprising:
    a first organic layer on a first electrode;
    a first emission layer on the first organic layer;
    a second emission layer on the first emission layer
    a second organic layer on the second emission layer;
    a second electrode on the second organic layer; and
    a third organic layer between the first emission layer and the second emission layer,
    wherein a thickness of the third organic layer is greater than a thickness of the first emission layer or a thickness of the second emission layer.

2. The organic light emitting display device of claim 1, wherein a thickness of the third organic layer is greater than a thickness of the second emission layer.

3. The organic light emitting display device of claim 1, wherein a thickness of the first emission layer is equal to or greater than a thickness of the first organic layer.

4. The organic light emitting display device of claim 1, wherein a thickness of the first emission layer is equal to or greater than a thickness of the second organic layer.

5. The organic light emitting display device of claim 1, wherein a thickness of the second emission layer is equal to or greater than a thickness of the first organic layer.

6. The organic light emitting display device of claim 1, wherein a thickness of the second emission layer is equal to or greater than a thickness of the second organic layer.

7. The organic light emitting display device of claim 1, wherein the first organic layer comprises a hole transfer layer and the hole transfer layer includes one or among a hole injection layer and a hole transport layer.

8. The organic light emitting display device of claim 1, wherein the second organic layer comprises an electron transfer layer and the electron transfer layer includes one or among an electron injection layer and an electron transport layer.

9. The organic light emitting display device of claim 1, wherein the third organic layer comprises one or more among a hole transfer layer, an electron transfer layer, a N-type charge generation layer, and a P-type charge generation layer.

10. The organic light emitting display device of claim 1, wherein one among the first electrode and the second electrode is a semi-transmissive electrode.

11. Organic light emitting display device of claim 1, wherein the first emission layer and the second emission layer emit lights having at least substantially the same color.

12. The organic light emitting display device of claim 1, wherein at least one among the first emission layer and the second emission layer comprises two or more kinds of hosts and at least one dopant of a fluorescent dopant or a phosphorescent dopant.

13. The organic light emitting display device of claim 1, further comprising a capping layer on the second electrode.

14. The organic light emitting display device of claim 1, wherein a thickness of the first emission layer is equal to or greater than a thickness of the second emission layer.

15. The organic light emitting display device of claim 1, wherein a thickness of the first organic layer is greater than a thickness of the second organic layer.

16. The organic light emitting display device of claim 1, wherein a thickness of the third organic layer is greater than a thickness of the first organic layer.

17. The organic light emitting display device of claim 1, wherein a thickness of the third organic layer is greater than a thickness of the second organic layer.

18. An organic light emitting display device, comprising:
    a first organic layer on a first electrode;
    a first emission layer on the first organic layer;
    a second emission layer on the first emission layer
    a second organic layer on the second emission layer;
    a second electrode on the second organic layer; and
    a third organic layer between the first emission layer and the second emission layer,
    wherein a thickness of the third organic layer is greater than a thickness of the first organic layer or a thickness of the second organic layer.

19. The organic light emitting display device of claim 18, wherein a thickness of the first organic layer is greater than a thickness of the second organic layer.

20. The organic light emitting display device of claim 18, wherein a thickness of the third organic layer is greater than a thickness of the first emission layer.

21. The organic light emitting display device of claim 18, wherein a thickness of the third organic layer is greater than a thickness of the second emission layer.

22. The organic light emitting display device of claim 18, wherein a thickness of the first emission layer is equal to or greater than a thickness of the first organic layer.

23. The organic light emitting display device of claim 18, wherein a thickness of the first emission layer is equal to or greater than a thickness of the second organic layer.

24. The organic light emitting display device of claim 18, wherein a thickness of the second emission layer is equal to or greater than a thickness of the first organic layer.

25. The organic light emitting display device of claim 18, wherein a thickness of the second emission layer is equal to or greater than a thickness of the second organic layer.

26. The organic light emitting display device of claim 18, wherein the first organic layer comprises a hole transfer layer and the hole transfer layer includes one or among a hole injection layer and a hole transport layer.

27. The organic light emitting display device of claim 18, wherein the second organic layer comprises an electron transfer layer and the electron transfer layer includes one or among an electron injection layer and an electron transport layer.

28. The organic light emitting display device of claim 18, wherein the third organic layer comprises one or more among a hole transfer layer, an electron transfer layer, a N-type charge generation layer, and a P-type charge generation layer.

29. The organic light emitting display device of claim 18, wherein one among the first electrode and the second electrode is a semi-transmissive electrode.

30. The organic light emitting display device of claim 18, wherein the first emission layer and the second emission layer emit lights having at least substantially the same color.

31. The organic light emitting display device of claim 18, wherein at least one among the first emission layer and the second emission layer comprises two or more kinds of hosts and at least one dopant of a fluorescent dopant or a phosphorescent dopant.

32. The organic light emitting display device of claim 18, further comprising a capping layer on the second electrode.

33. The organic light emitting display device of claim 18, wherein a thickness of the first emission layer is equal to or greater than a thickness of the second emission layer.

34. An organic light emitting display device, comprising:
a first organic layer on a first electrode;
a first emission layer on the first organic layer;
a second emission layer on the first emission layer
a second organic layer on the second emission layer;
a second electrode on the second organic layer; and
a third organic layer between the first emission layer and the second emission layer,
wherein a thickness of the first organic layer is greater than a thickness of the second organic layer.

35. The organic light emitting display device of claim 34, wherein a thickness of the third organic layer is greater than a thickness of the first organic layer.

36. The organic light emitting display device of claim 34, wherein a thickness of the third organic layer is greater than a thickness of the second organic layer.

37. The organic light emitting display device of claim 34, wherein a thickness of the third organic layer is greater than a thickness of the first emission layer.

38. The organic light emitting display device of claim 34, wherein a thickness of the third organic layer is greater than a thickness of the second emission layer.

39. The organic light emitting display device of claim 34, wherein a thickness of the first emission layer is equal to or greater than a thickness of the first organic layer.

40. The organic light emitting display device of claim 34, wherein a thickness of the first emission layer is equal to or greater than a thickness of the second organic layer.

41. The organic light emitting display device of claim 34, wherein a thickness of the second emission layer is equal to or greater than a thickness of the first organic layer.

42. The organic light emitting display device of claim 34, wherein a thickness of the second emission layer is equal to or greater than a thickness of the second organic layer.

43. The organic light emitting display device of claim 34, wherein the first organic layer comprises a hole transfer layer and the hole transfer layer includes one or among a hole injection layer and a hole transport layer.

44. The organic light emitting display device of claim 34, wherein the second organic layer comprises an electron transfer layer and the electron transfer layer includes one or among an electron injection layer and an electron transport layer.

45. The organic light emitting display device of claim 34, wherein the third organic layer comprises one or more among a hole transfer layer, an electron transfer layer, a N-type charge generation layer, and a P-type charge generation layer.

46. The organic light emitting display device of claim 34, wherein one among the first electrode and the second electrode is a semi-transmissive electrode.

47. The organic light emitting display device of claim 34, wherein the first emission layer and the second emission layer emit lights having at least substantially the same color.

48. The organic light emitting display device of claim 34, wherein at least one among the first emission layer and the second emission layer comprises two or more kinds of hosts and at least one dopant of a fluorescent dopant or a phosphorescent dopant.

49. The organic light emitting display device of claim 34, further comprising a capping layer on the second electrode.

50. The organic light emitting display device of claim 34, wherein a thickness of the first emission layer is equal to or greater than a thickness of the second emission layer.

* * * * *